(12) United States Patent
Ekambaram et al.

(10) Patent No.: US 9,998,120 B1
(45) Date of Patent: Jun. 12, 2018

(54) CIRCUIT FOR AND METHOD OF SHIFTING A HIGH RANGE INPUT COMMON MODE VOLTAGE

(71) Applicant: Xilinx, Inc., San Jose, CA (US)

(72) Inventors: Sabarathnam Ekambaram, Hyderbad (IN); Hari Bilash Dubey, Hyderabad (IN)

(73) Assignee: XILINX, INC., San Jose, CA (US)

( * ) Notice: Subject to any disclaimer, the term of this patent is extended or adjusted under 35 U.S.C. 154(b) by 0 days. days.

(21) Appl. No.: 15/448,494

(22) Filed: Mar. 2, 2017

(51) Int. Cl.
| H03K 19/0175 | (2006.01) |
| H03K 19/094 | (2006.01) |
| H03K 19/0185 | (2006.01) |
| H03K 19/177 | (2006.01) |

(52) U.S. Cl.
CPC ........... H03K 19/018521 (2013.01); H03K 19/017581 (2013.01); H03K 19/1776 (2013.01)

(58) Field of Classification Search
None
See application file for complete search history.

(56) References Cited

U.S. PATENT DOCUMENTS

| 6,052,025 A * | 4/2000 | Chang ............... H03F 3/45219 330/253 |
| 7,375,585 B2 * | 5/2008 | Trifonov ............ H03F 3/45219 330/258 |
| 7,532,072 B1 * | 5/2009 | Tavakoli Dastjerdi ............ H03F 1/3211 330/258 |
| 7,545,214 B2 * | 6/2009 | Rallabandi ............ H03F 3/3022 330/255 |
| 8,058,924 B1 | 11/2011 | Ren et al. |
| 8,134,813 B2 | 3/2012 | Karp et al. |
| 8,222,954 B1 | 7/2012 | Ren et al. |
| 8,330,543 B2 * | 12/2012 | Lin ..................... H03F 3/45183 330/253 |
| 9,490,832 B1 | 11/2016 | Zhou et al. |

* cited by examiner

*Primary Examiner* — Anh Tran
(74) *Attorney, Agent, or Firm* — John J. King

(57) ABSTRACT

A circuit for shifting an input common mode voltage is described. The circuit comprises a first current path configured to generate a first current between a reference voltage and a ground potential, the first current path having a first output; a second current path configured to generate a second current between the reference voltage and the ground potential, the second current path having a second output; a first bias current control circuit coupled to the first current path and the second current path, wherein the first bias control circuit is configured to receive the input voltage to control the current in the first current path and the second current path; and a second bias current control circuit coupled to the first current path and the second current path, wherein the second bias control circuit is configured to receive the input voltage to control the current in the first current path and the second current path. A method of shifting an input common mode voltage is also described.

20 Claims, 8 Drawing Sheets

CIRCUIT FOR AND METHOD OF SHIFTING A HIGH RANGE INPUT COMMON MODE VOLTAGE

TECHNICAL FIELD

The present invention relates generally to integrated circuit devices, and in particular, to a circuit for and a method of shifting a high range input common mode voltage.

BACKGROUND

Differential receivers that support standards such as low voltage differential signaling (LVDS), Sub-LVDS, scalable low voltage signaling (SLVS), differential high-speed transceiver logic (DIFF_HSTL) and differential stub speed terminated logic (DIFF_HSTL) are powered by a 1.8V supply which is sufficient to handle input common mode voltage from 1.425V to 0V. However, as the supply voltages in ICs continues to decrease, the operation of certain transistors may be affected. For example, in a conventional receiver device such as a folded cascade structure where the supply voltage is very low, there may not be enough headroom to keep the devices in saturation. As a result, there is higher variation in current and duty cycle/performance. Because a folded cascade structure is a high gain structure, even a small offset in the differential input may result in high skew. Further, a folded cascade structure may not support higher common mode voltages, which may be as high as the supply voltage. With efforts to reduce Vccaux_IO supply voltages below 1.8V to 1.5V for example, these existing problems will be further aggravated.

Accordingly, circuits and methods that enable the shifting of a common mode voltage to accommodate different common mode voltages in integrated circuit devices would be beneficial.

SUMMARY

A circuit for shifting an input common mode voltage is described. The circuit comprises a first current path configured to generate a first current between a reference voltage and a ground potential, the first current path having a first output; a second current path configured to generate a second current between the reference voltage and the ground potential, the second current path having a second output; a first bias current control circuit coupled to the first current path and the second current path, wherein the first bias control circuit is configured to receive the input voltage to control the current in the first current path and the second current path; and a second bias current control circuit coupled to the first current path and the second current path, wherein the second bias control circuit is configured to receive the input voltage to control the current in the first current path and the second current path.

A method of shifting an input common mode voltage is also described. The method comprises generating a first current in a first current path between a reference voltage and a ground potential, the first current path having a first output; generating a second current in a second current path between the reference voltage and the ground potential, the second current path having a second output; configuring a first bias current control circuit to receive the input voltage to control the current in the first current path and the second current path in response to the input common mode voltage; and configuring a second bias current control circuit is configured to receive the input voltage to control the current in the first current path and the second current path in response to the input common mode voltage.

Other features will be recognized from consideration of the Detailed Description and the claims, which follow.

DETAILED DESCRIPTION

While the specification includes claims defining the features of one or more implementations of the invention that are regarded as novel, it is believed that the circuits and methods will be better understood from a consideration of the description in conjunction with the drawings. While various circuits and methods are disclosed, it is to be understood that the circuits and methods are merely exemplary of the inventive arrangements, which can be embodied in various forms. Therefore, specific structural and functional details disclosed within this specification are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting, but rather to provide an understandable description of the circuits and methods.

The circuits and methods set forth below enable the shifting of common mode voltage to accommodate decreasing reference voltages such as Vccaux_IO in an integrated circuit. By controlling the current in the output paths of a pre-amplifier, the operation of the receiver can be improved. According to one implementation, the pre-amplifier is implemented to enable an Input Common Mode Voltage to vary from a supply voltage to 0V and to enable an input swing to vary from 70 mV to 600 mV. The circuits and methods also have a better offset tolerance, better duty cycle performance, can support higher frequency range for a given current, and can reduce overall current consumption by 40% for same performance. Input/outputs (IOs) in Field Programmable Gate Arrays (FPGAs) are primarily general purpose IO's. By enabling a greater number of protocols/standards that the FPGA supports, the usage of the chip can be extended to wide variety of applications. The current consumption of single 10 may be reduced by implementing the circuits and methods set forth below, and therefore significantly reduce power. While the circuits and methods may apply to a pre-amplifier structure, it should be noted that the circuits and methods could be implemented in any application requiring level shifting, such as high speed comparators or level translators enabling switching from on voltage domain to another voltage domain.

Figure 1:
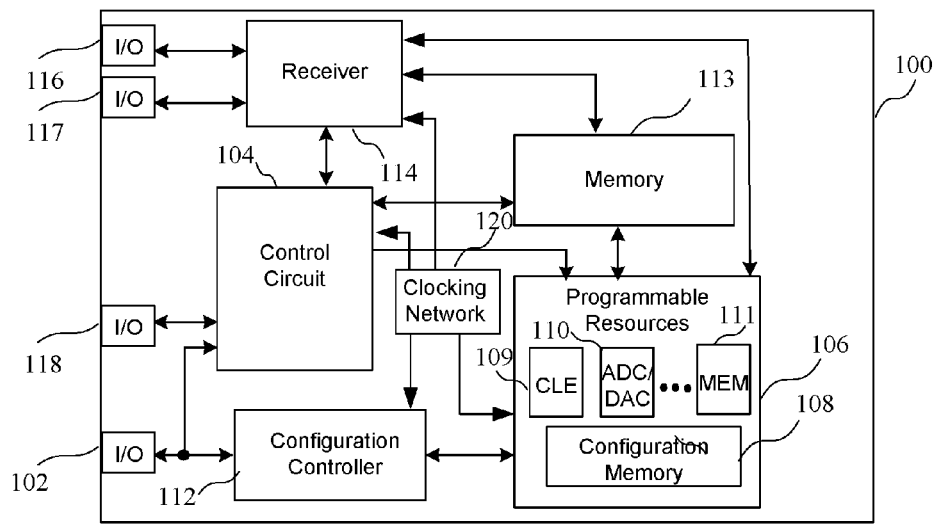
FIG. 1 is a block diagram of an integrated circuit comprising a circuit for receiving data.

Turning first to FIG. 1, a block diagram of an integrated circuit 100 comprising a circuit for routing data in the integrated circuit is shown. In particular, an input/output port 102 is coupled to a control circuit 104 that controls programmable resources 106 having configuration memory 108 having configurable logic elements 109, analog-to-digital (ADC) and digital-to-analog (DAC) circuit 110, and memory 111. Configuration data may be provided to the configuration memory 108 by a configuration controller 112. The configuration data enables the operation of the programmable resources 106. A memory 113 may be coupled to the control circuit 104 and the programmable resources 106. A receiver circuit 114 may be coupled to the control circuit 104, programmable resources 106 and the memory 113, and may receive signals at the integrated circuit by way of I/O ports 116 and 117. It should be noted that the receiver circuit 114 comprises a plurality of differential receivers, as described in more detail in the remaining figures. Other I/O ports may be coupled to circuits of the integrated circuit device, such as I/O port 118 that is coupled to the control circuit 104 as shown. A clocking network 120 is coupled to various elements of the circuit of FIG. 1.

Figure 2:
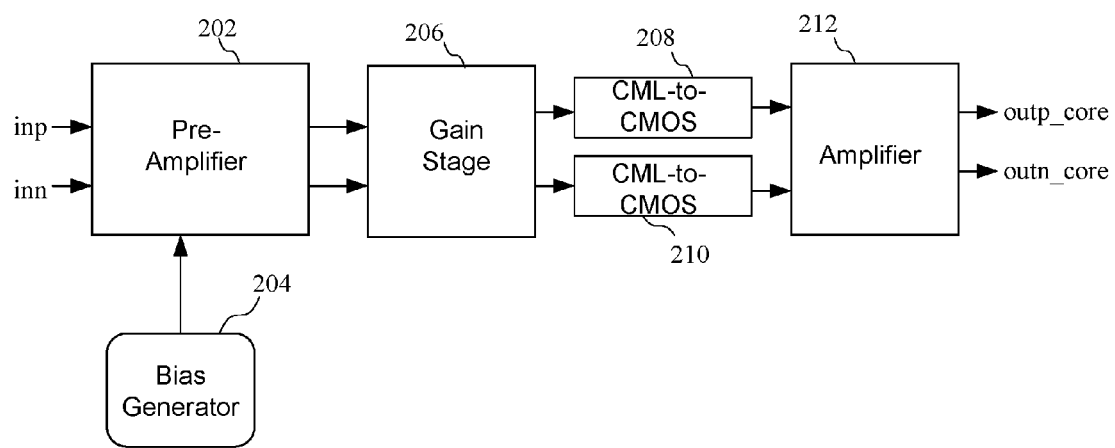
FIG. 2 is a block diagram showing elements of a receiver circuit.

Turning now to FIG. 2, a block diagram showing elements of a receiver circuit, such as receiver 114 of FIG. 1, is shown. The receiver circuit of FIG. 2 comprises a pre-amplifier circuit 202 configured to receive differential input signals inn and inp, which will have same common mode voltage. A bias generator 204 is configured to control bias currents of the pre-amplifier 202, as will be described in more detail below. The output of the pre-amplifier is coupled to a gain stage 206. The amplified signal generated by the gain stage 206 may be provided to CML-to-CMOS converters 208 and 210 which generates CMOS level signals. The signals amplified by an amplifier 212 are generated as output signals outp_core and outn_core. Implementation of the pre-amplifier 202 and the bias generator 204 will be described in more detail below in FIGS. 3 and 4, respectively.

Figure 3:
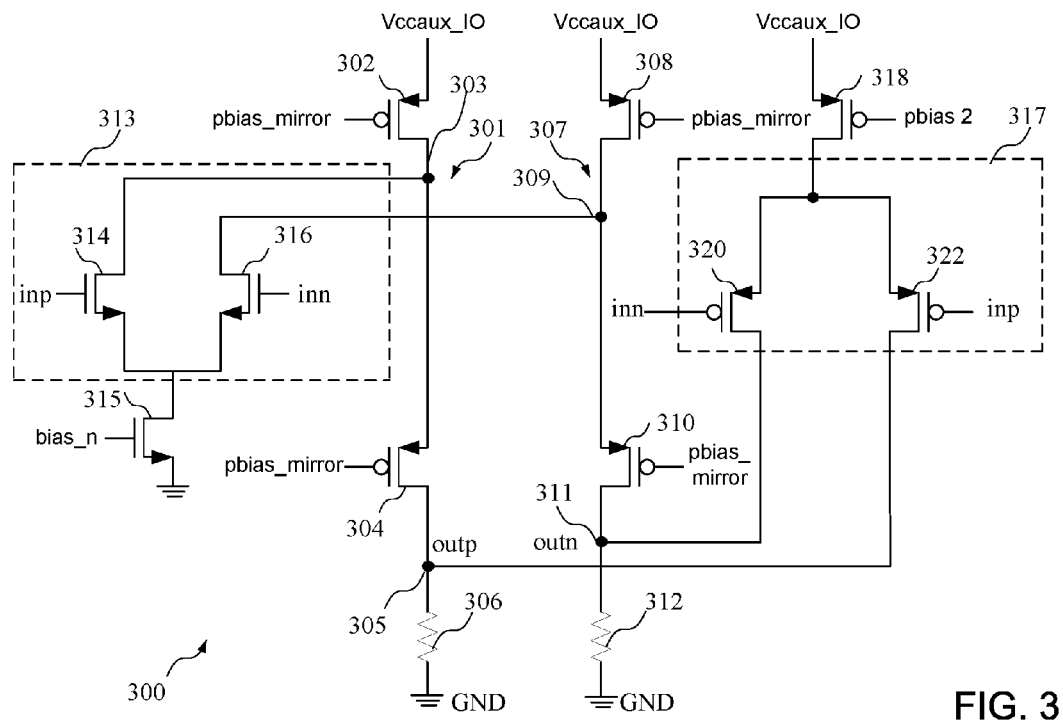
FIG. 3 is a block diagram of a pre-amplifier 300.

Turning now to FIG. 3, a block diagram of the pre-amplifier 202 of FIG. 2 is shown. The pre-amplifier 300 of FIG. 3, which could be implemented as pre-amplifier 202, comprises a first current path 301 having a first transistor 302 coupled in series at a first current control node 303 to a second transistor 304, where a first output outp is provided at an output node 305 at the drain of transistor 304. A resistor 306 is provided between the drain of the transistor 304 and ground (GND). The pre-amplifier 300 also comprises a second current path 307 having a third transistor 308 and a fourth transistor 310 coupled in series at the second current control node 309, where a second output outn is provided at a node 311 at the drain of transistor 310. The transistors 302 and 308 are coupled to a reference voltage, shown here as Vccaux_IO, at their sources. Reference voltage Vccaux_IO may be one of a number of available references voltages. A resistor 312 is provided between the drain of the transistor 310 and ground.

The pre-amplifier 300 further comprises a first bias current control circuit 313 having a first transistor 314, shown here as an N-channel transistor, configured to receive the inp signal and having a drain coupled to the first current control node 303, and a second transistor 316, shown here as an N-channel transistor, configured to receive the inn signal and having a drain coupled to the second current control node 309. The sources of the transistor 314 and the transistor 316 are coupled to a drain of a bias control transistor 315 configured to receive an N-channel bias signal bias_n generated by the bias control generator 204.

The pre-amplifier 300 also comprises a second bias current control circuit 317 having a bias control transistor 318, shown here as a P-channel transistor, configured to receive a P-channel bias signal pbias 2 and control the current in a first transistor 320, shown here as an P-channel transistor configured to receive the inn signal and having a drain coupled to the second current control node 311, and a second transistor 322, shown here as an P-channel transistor configured to receive the inp signal and having a drain coupled to the first current control node 305. The P-channel transistors 302, 304, 308 and 310 of the current paths receive a pbias_mirror signal generated by the bias generator 204, while the P-channel transitor 318 is configured to receive the pbias 2 generated by the bias generator 204. As will be described in more detail below, the first and second bias current control circuit enable the pre-amplifier circuit 300 to receive a high range of a common mode voltage input signal.

Figure 4:
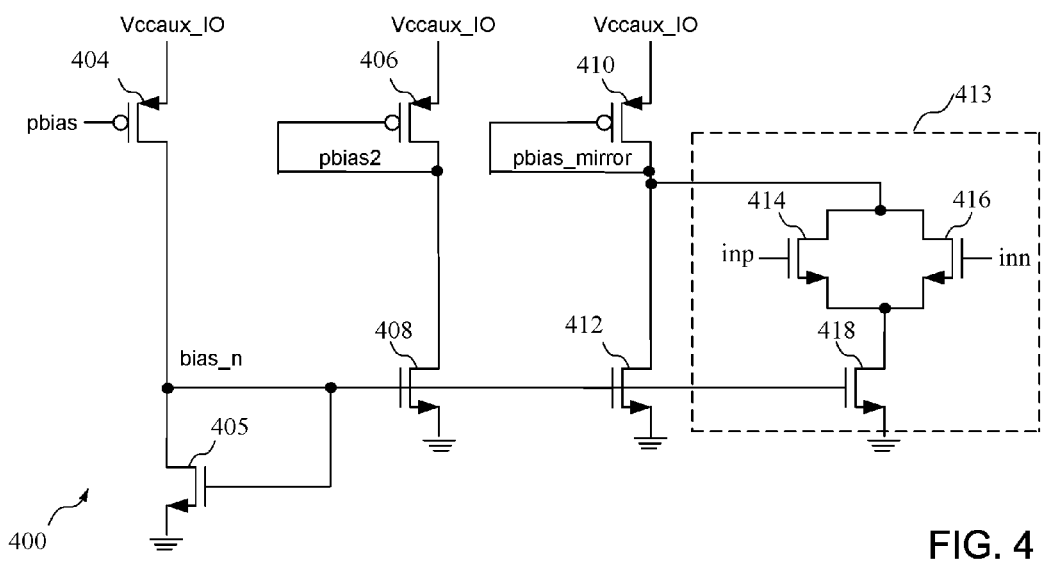
FIG. 4 is a bock diagram of a bias generator 400.

Turning now to FIG. 4, a bock diagram of a bias generator 400, which may be implemented as bias generator 204 of FIG. 2, is shown, where the bias generator 400 generates the control signals for the transistors of FIG. 3. More particularly, the bias generator 400 comprises a plurality of current paths implemented as current mirrors, including a first current path having a P-channel transistor 404 configured to receive a bias signal pbias at its gate, and is coupled in series with an N-channel transistor 405 having its gate coupled to it drain as shown. A second current path comprises a P-channel transistor 406 configured with its gate coupled to its drain to generate the pbias2, where the drain is coupled to the drain of transistor 408. A third current path also a P-channel transistor 410 configured with its gate coupled to its drain to generate the pbias_mirror signal, where the drain is coupled to the drain of transistor 412. A bias current control circuit 413 is also coupled to the drain of the transistor 410 and controls the pbias_mirror value by providing a parallel path for the current generated by the transistor 410. The current control circuit 413 comprises a first transistor 414 configured to receive the input signal inp coupled in parallel with a second transistor 416 configured to receive the input signal inn. The sources of the transistors 414 and 416 are coupled to a drain of a transistor 418 configured to receive the bias_n signal generated at the drains of the transistors 404 and 405. While the arrangement of elements of the current control circuit 413 shows an example of a circuit to divert current generated by the transistor 410 to control the pbias_mirror signal, other arrangements of elements could be implemented, as will be described in more detail in reference to FIGS. 5 and 6.

Figure 5:
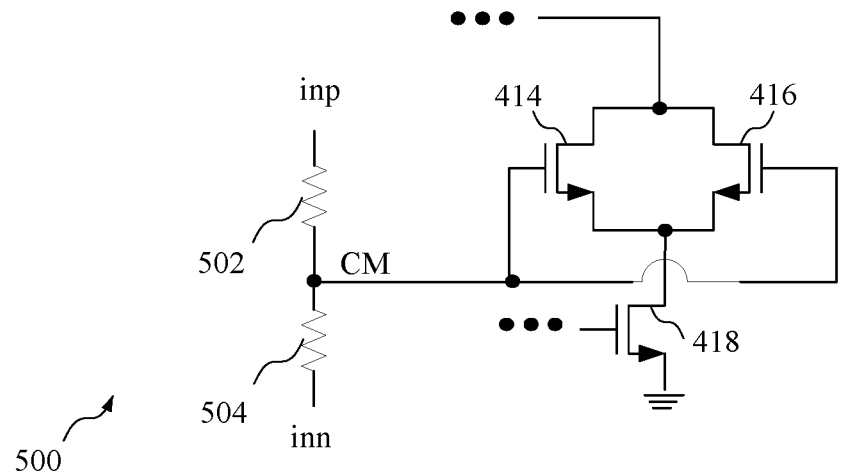
FIG. 5 is a block diagram of a current control circuit 500.

More particularly, the block diagram of a current control circuit 500 of FIG. 5, which may be implemented as a current control circuit in place of the current control circuit 413, shows the use of a resistor divider comprising a first resistor 502 coupled in series with a second resistor 504 between the input signals inn and inp. The common mode (CM) signal generated at the connected terminals of the resistors 502 and 504 is provided to the gates of the transistors 414 and 416. That is, while the gates of transistors 414 and 416 could be controlled by inn and inp as shown in FIG. 4, any voltage derived from inn and inp could be provided to the gates of transistors 414 and 416. The use of the resistor divider network of FIG. 5 ensures that there is no switching at the drain of transistor 410, and therefore reduces an error in current multiplication and enables the current in transistor 418 to more accurately mirrors the current in transistor 405.

Figure 6:
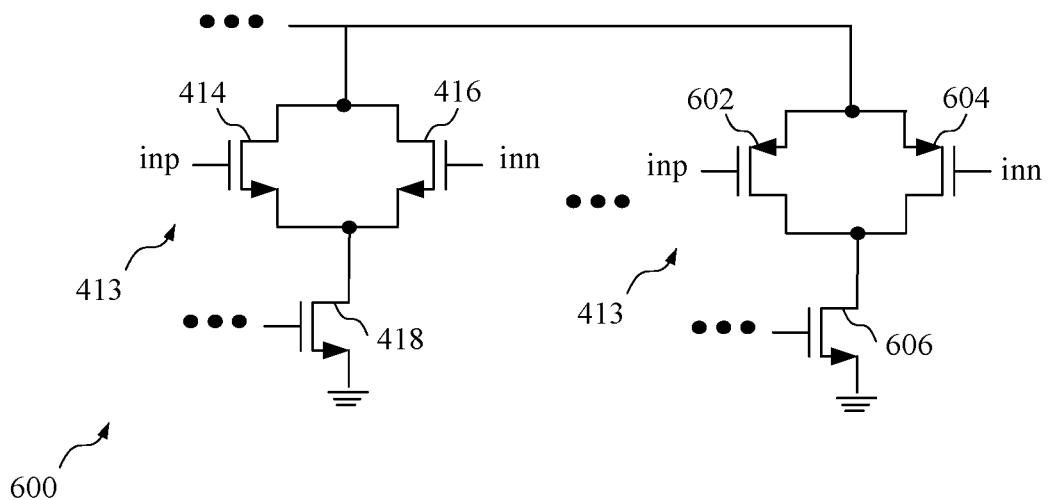
FIG. 6 is a block diagram of a current control circuit 600.

A block diagram of another alternate implementation of a current control circuit 600 is shown in FIG. 6. More particularly, multiple current control circuits 413 could be implemented according to the current control circuit 600 of FIG. 6 using transistors to better control the current. While the multiple current control circuits 413 could be implemented in FIG. 6. using N-channel transistors, some of the current control circuits 413 could include P-channel transistors, such as the transistors 602, 604 and 606 as shown. The selection of current control circuits would be made to enable $I_2=I_1+I_3$ in certain conditions and $I_2=I_1$ in other conditions, where the currents $I_2$, and $I_3$ are shown in FIG. 8.

Figure 7:
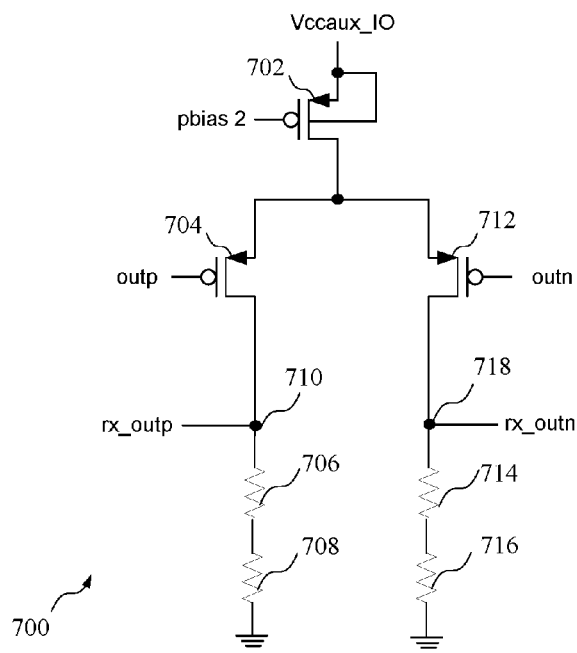
FIG. 7 is a block diagram of a gain stage 700.

Turning now to FIG. 7, a block diagram of the gain stage 700, which may be implemented as gain stage 206 of FIG. 2, is shown. The gain stage 700 comprises a P-channel transistor 702 configured to receive a P-channel bias (pbias 2) signal at its gate, and a drain coupled to two output paths, each coupled to receive an output signal from the pre-amplifier 202. More particularly, a first output path comprises a transistor 704 configured to receive the output signal outp from the pre-amplifier at its gate, and generates a receiver output signal rx_outp at its drain. The drain is coupled in series with a pair of resistors 706 and 708 at an output node 710. A second output path comprises a transistor 712 configured to receive the output signal outn from the pre-amplifier at its gate, and generates a receiver output signal rx_outn at its drain. The transistor 712 is coupled in series with a pair of resistors 714 and 716 at an output node 718. While the circuit of FIG. 7 represents a circuit that provides an appropriate gain to signals generated at outputs of the pre-amplifier, it should be understood that other circuits could be implemented for the gain stage 700.

Figure 8:
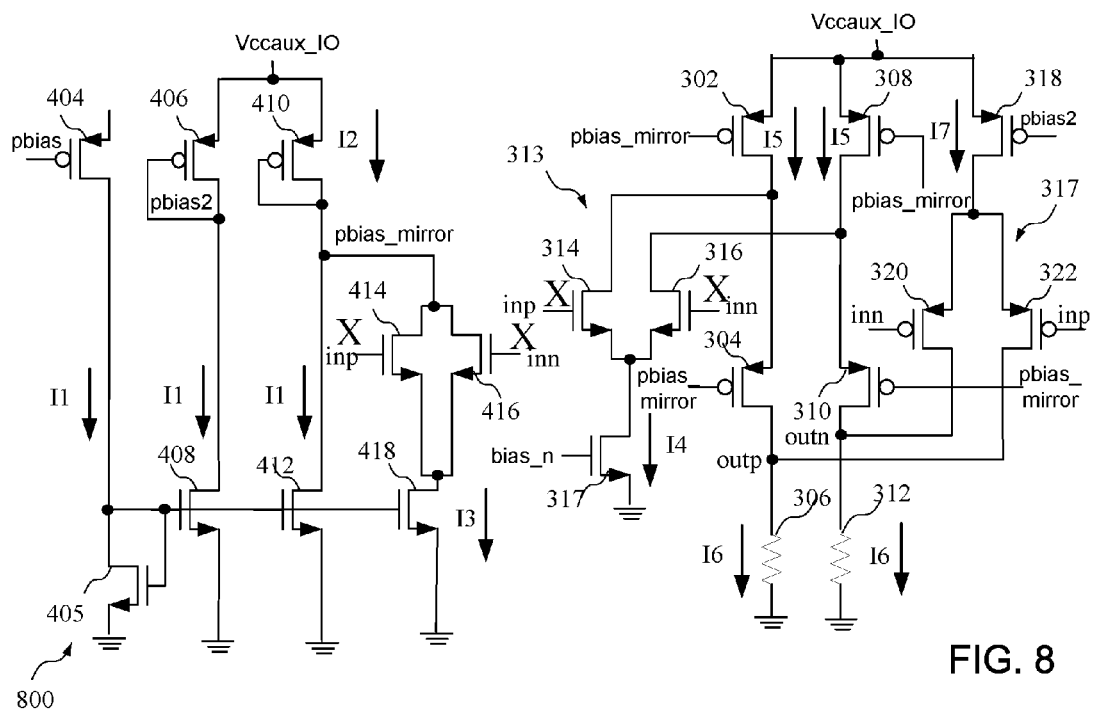
FIG. 8 is a block diagram showing a circuit 800 which may include the pre-amplifier 202 and bias generator 204 according to a first implementation for receiving lower common mode voltages.

Turning now to FIG. 8, a block diagram showing an implementation of a circuit 800, which may include the pre-amplifier 202 and bias generator 204, according to a first implementation for receiving lower common mode voltages is shown. At lower common mode voltages, such as when the input signal inp and inn are between 0 and the threshold voltage (Vt) of an NMOS transistor, transistors having an X are turned off (based upon the range of inn and inp) and the following currents are driven in the circuit:

$I_2=I_1$ $I_5=x*I_2$ (where x can be any integer);

$I_7=y*I_1$ (where y can be any integer);

$I_4=0$;

$I_6=I_5+I_7/2$; and $I_6=x*I_1+(y*I_1)/2$      Equation 1, where the voltage outp and outn are equal to I6*R, and R is the resistance value of resistors 306 and 312. That is, because a lower common mode voltage input is provided to the inputs of the pre-amplifier 202, the bias current control circuit 317 is turned on to increase the current 16 in the resistors 306 and 312 due to the current 17, and therefore increase the outputs outp and outn of the pre-amplifier.

Figure 9:
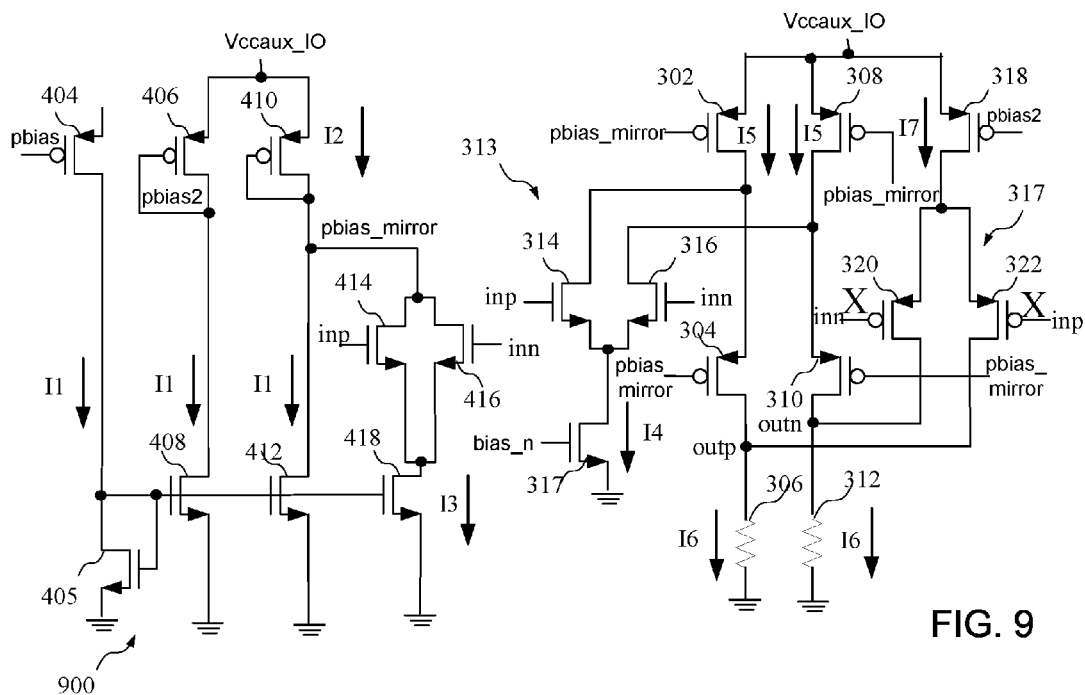
FIG. 9 is a block diagram showing a circuit 900 which may include the pre-amplifier 202 and bias generator 204 according to a first implementation for receiving higher common mode voltages.

Turning now to FIG. 9, a block diagram showing an implementation of a circuit 900, which may include the pre-amplifier 202 and bias generator 204, according to an implementation for receiving higher common mode voltages is shown. At higher common mode voltages, such as when the input signal inp and inn are between Vccaux_IO and Vccaux_IO−Vt, the transistors 320 and 322 of the second bias current control circuit 317 are turned off, and the following currents are driven in the circuit:

$I_2=I_1+I_3$, $I_5=x*I_2$ (where x can be any integer);

$I_7=0$;

$I_4=z*I_1$ (where z can be any integer);

$I_6=I_5-I_4/2$; and $I_6=x*(I_1+I_3)-(z*I_1)/2$

Therefore, by making $x*I_3=y*I_1$ and $y=z$, $I_6=x*I_1+(y*I_1)/2$      Equation 2, where the voltage outp and outn is equal to I6*R. From Equation 1 and Equation 2, $I_6$ is equal in both cases and hence we can achieve output common mode voltage constant irrespective of input common mode voltage.

Figure 10:
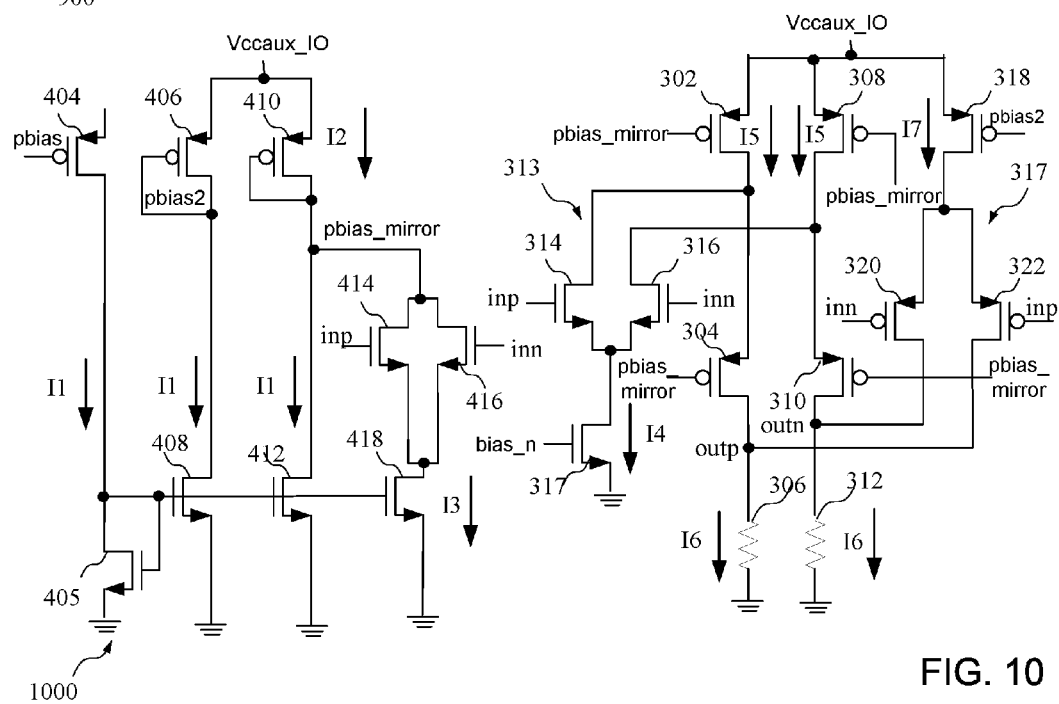
FIG. 10 is a block diagram showing a circuit 800 which may include the pre-amplifier 202 and bias generator 204 according to a first implementation for receiving intermediate common mode voltages.

Turning now to FIG. 10, a block diagram showing an implementation of a circuit 1000, which may include the pre-amplifier 202 and bias generator 204, according to a first implementation for receiving intermediate common mode voltages is shown. At intermediate common mode voltages, such as when the input signal inp and inn are between Vt of an NMOS transistor and Vccaux_IO-Vt, the following currents are driven in the circuit:

$I_2=I_1+I_3$, $I_5=x*I_2$ (where x can be any integer);

$I_7=y*I_1$ (where y can be any integer);

$I_4=z*I_1$ (where z can be any integer);

$I_6=I_5+I_7/2-I_4/2$;

$I_6=x*(I_1+I_3)+(y*I_1)/2-(z*I_1)/2$; and $I_6=x*I_1(y*I_1)$      Equation 3, where the voltage outp and outn is equal to I6*R. In this case, both the first bias current control circuit 313 and the second bias current control circuit 317 affect the current through resistors 306 and 312, and therefore maintain the outputs signals outp and outn. From Equation 3, If x>>y, the output common mode voltage is near-constant and equals Equation 1 and Equation 2. Thus, by carefully choosing x, y, z and 13, the output common mode voltage can be made near constant for all input common mode voltage.

Figure 11:
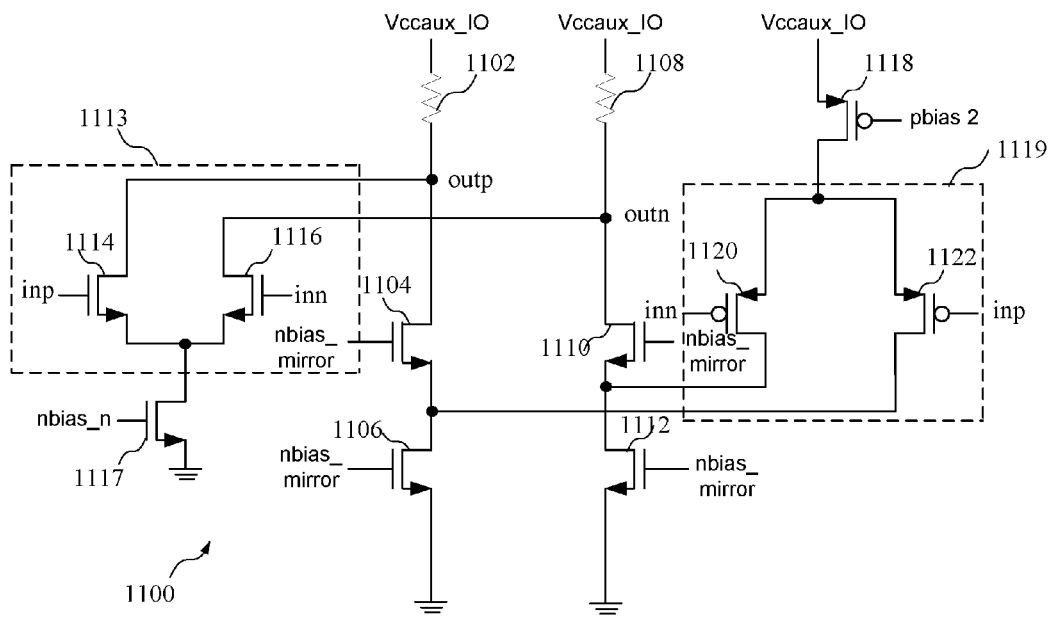
FIG. 11 is a block diagram of a pre-amplifier 1100 using N-channel transistors in the output paths.

Turning now to FIG. 11, a block diagram of a pre-amplifier 1100, which may include the pre-amplifier 202 of FIG. 2 using N-channel transistors in the output paths is shown. In particular, the first current path comprises a resistor 1102 coupled in series with a first transistor 1104 and a second transistor 1106, each of which is configured to receive an nbias_mirror signal at its base. The second current path comprises a resistor 1108 coupled in series with a first transistor 1110 and a second transistor 1112, each of which is configured to receive an nbias_mirror signal at its base. The outputs outp and outn are generated at resistors 1102 and 1108, respectively. The first bias current control circuit 1113 is implemented using N-channel transistors, and particularly, transistors 1114 and 1116 receiving inp and inn at their gates, respectively, and having sources connected together at a bias control transistor 1117 configured to receive nbias_n at its base. The second bias current control circuit 1119 is implemented using P-channel transistors, and particularly, transistors 1120 and 1122 receiving inn and inp at their gates, respectively, and having sources connected together at a bias control transistor 1118 configured to receive nbias_n at its base. With the modification as shown in FIG. 11, the circuit of FIG. 11 can also be used to convert a high range input common mode voltage to a near—constant high output common mode voltage.

Figure 12:
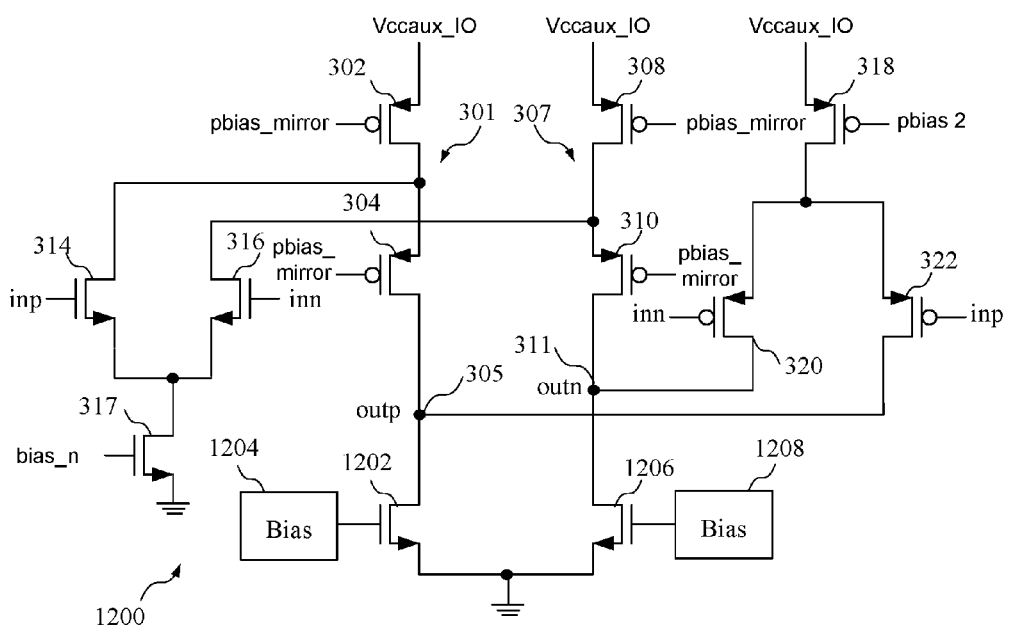
FIG. 12 is a block diagram of a pre-amplifier 1200 having bias current transistors controlling current in the output paths.

Turning now to FIG. 12, a block diagram of a pre-amplifier 1200, which may be implemented as the pre-amplifier 202 of FIG. 2, having bias current transistors controlling current in the output paths is shown. More particularly, the current in the current paths can be controlled by controllable transistors and bias circuits. For example, the first current path 301 can be controlled by a transistor 1202 coupled between the output node 305 generating the outp signal and ground, where a bias circuit 1204 is coupled to the gate of the transistor 1202. Similarly, the second current path 307 can be controlled by a transistor 1206 coupled between the output node 311 generating the outn signal and ground, where a bias circuit 1208 is coupled to the gate of the transistor 1206. That is, 306 and 312 need not be resistors, but can be transistors (PMOS or NMOS) biased in linear region. The purpose of 306 and 312 is just to provide a voltage drop proportional to the current given to those devices, and can be implemented as transistors.

Figure 13:
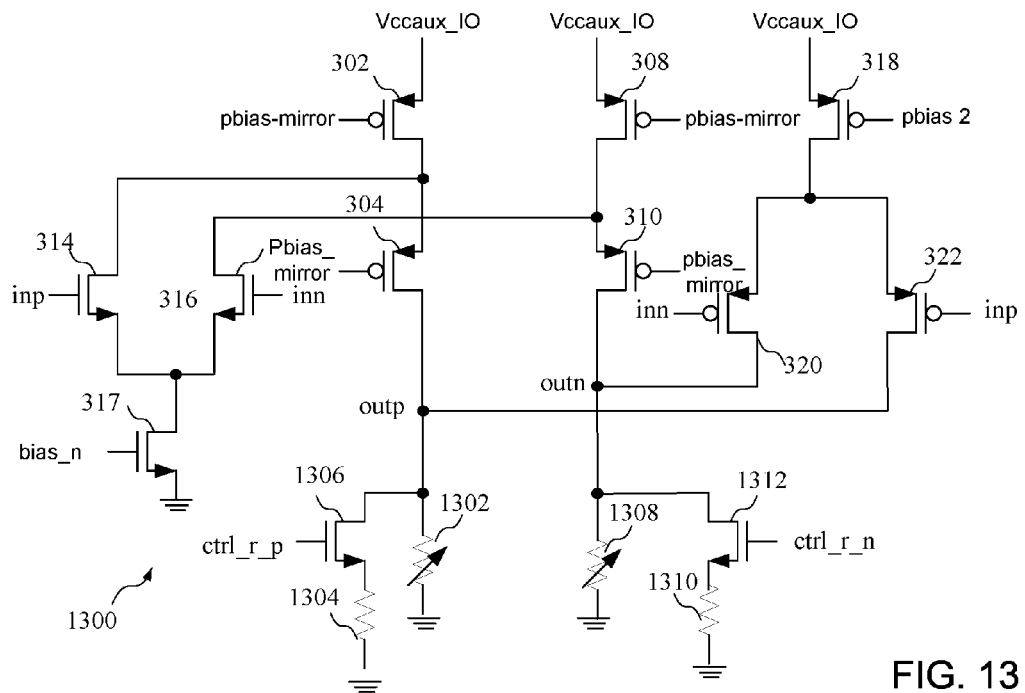
FIG. 13 is a block diagram of a pre-amplifier 1300 having resistors controlling the current in the output paths.

Turning now to 13, a block diagram of the pre-amplifier 1300 which may be implemented as pre-amplifier 202 resistors controlling the current in the output paths is shown. As shown in FIG. 13, the current in the paths generating the output signals outp and outn can be controlled by resistors, including resistor paths controlled by a transistor. For example, the first current path 301 generating the outp signal comprises a first resistor 1302 coupled between the output node 305 generating the outp signal and ground and a second resistor 1304 coupled in parallel with the first resistor and in series with a control transistor 1306. Similarly, the second current path 307 generating the outn signal comprises a third resistor 1308 coupled between the output node 1311 generating the outn signal and ground, and a fourth resistor 1310 coupled in parallel with the third resistor 1308 and in series with a control transistor 1312. Control signals ctrl_r_p and ctrl_r_n are coupled to the gates of the transistors 1306 and 1312, respectively, to control the current in the corresponding resistors. The resistors 1302 and 1308 can be programmable, which will enable fixing the output common mode voltage based on requirement. By controlling transistors 1306 and 1312, output common mode voltage can be fixed to any desired value. While a single transistor/resistor combination (e.g. 1306 and 1312) is shown, there can be several such transistor/resistor combinations to control the resolution of output common mode and swing at the output node to enable meeting different standards or protocols.

Figure 14:
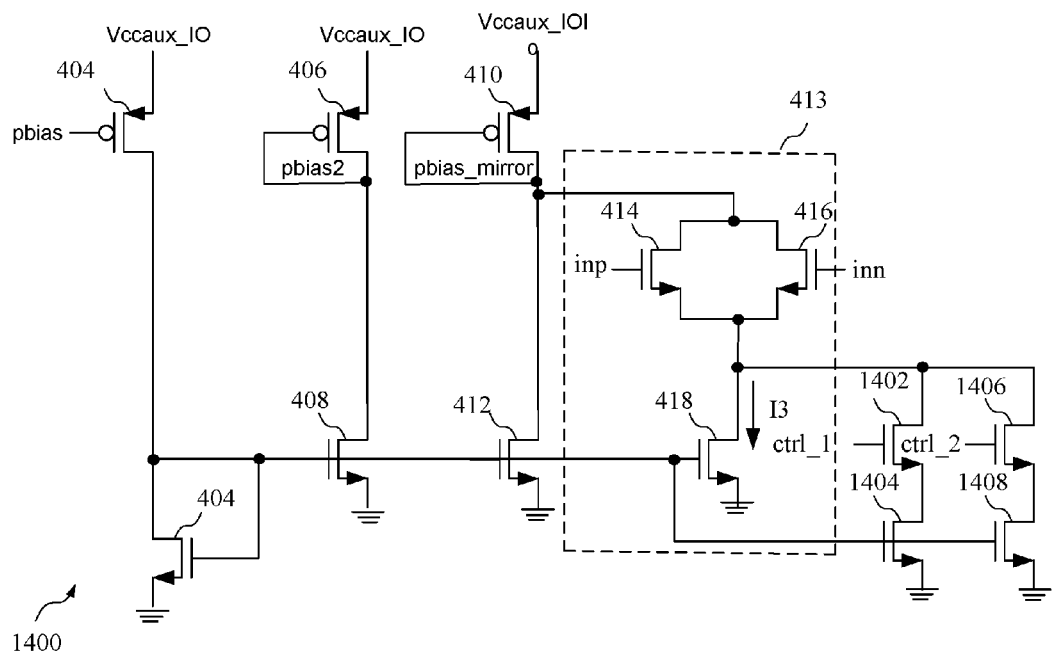
FIG. 14 is another block diagram of a bias 1400 having controllable current paths in addition to the current control circuit 413.

Turning now to FIG. 14, a block diagram of a bias generator 1400, which may be implemented as the bias generator 204 of FIG. 2 having current paths in addition to the current control circuit 413 is shown. Current I3 can be programmable and can be decided based on requirement. As shown in the FIG. 14, transistors 1402 and 1406 can be enabled or disabled by control signals ctrl_1 and ctrl_2 to control I3, which helps in the reduction of current based on frequency of operation or based on standard supported.

Offset is an important parameter which introduces duty cycle distortions. Offset can be perceived in two ways: first by input devices having an offset when two inputs of differential amplifier is set to same value, but the two differential outputs is not same value, and second when two inputs itself have two different common mode voltage. Conventional folded cascode topologies by virtue of design, amplifies difference between inputs by a factor of differential gain. Therefore, in addition to amplifying difference between both inputs, it also amplifies difference in common mode by high gain factor. Accordingly, for high gain amplifier, it can be observed that for inputs/circuit which has offset, the rise/fall delay will have a skew proportional to offset to swing ratio. This difference gives rise to duty cycle distortion.

Using the circuits and methods set forth above, it can be observed by those skilled in art that though preamplifier 202 offers similar gains for both common and differential mode signals, differential signal magnitude to gain stage 206 is considerably larger and common mode voltage is highly controlled as compared to a single stage High Gain amplifier which receives input directly (Huge variation in common mode). Due to current steering in gain stage 206, high swing from pre-amplifier 202 shuts down one arm of input pair of gain stage 206 irrespective of input offset and thus helps maintain balanced rise and fall delays at the output of gain stage 206 despite offset. Hence better duty cycle performance is achieved.

Figure 15:
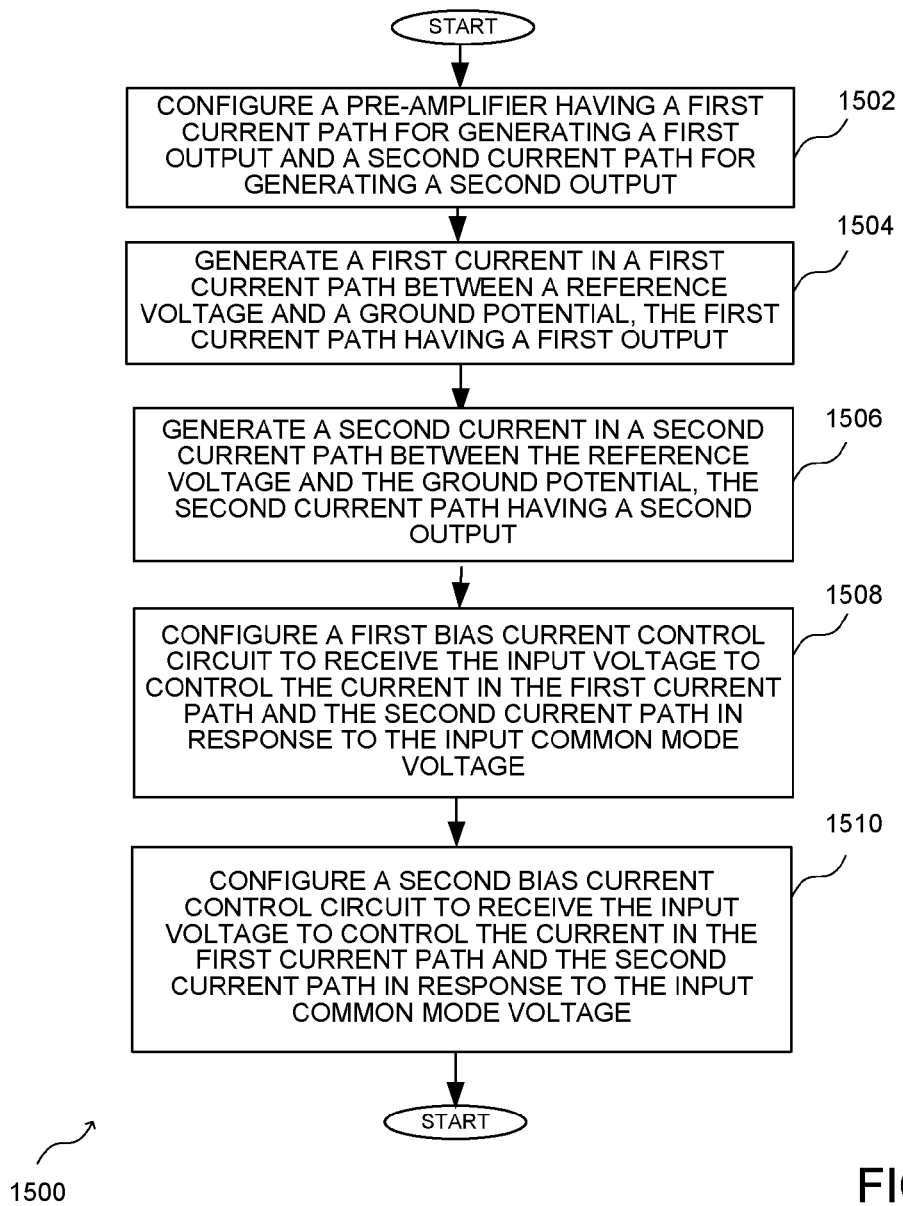
FIG. 15 is a flow chart showing a method of shifting an input common mode voltage.

Turning now to 15. a flow chart 1500 shows an example of a method of shifting an input common mode voltage. The method of FIG. 15 could be implemented using any of the circuits of FIGS. 1-14. A pre-amplifier having a first current path for generating a first output and a second current path for generating a second output is configured at a block 1502. The first current path could be current path 301 and the second current path could be current path 307, for example. A first current is generated in a first current path between a reference voltage and a ground potential, the first current path having a first output at a block 1504. A second current is generated in a second current path between the reference voltage and the ground potential, the second current path having a second output at a block 1506. A first bias control circuit, such as bias control circuit 313, is configured to receive the input voltage to control the input current in the first current path and the second current path in response to the input common mode voltage at a block 1508. A second bias control circuit, such as bias control circuit 317, is configured to receive the input voltage to control the current in the first current path and the second current path in response to the input common mode voltage at a block 1510.

Generating a first current in a first current path may comprise controlling a first transistor coupled in series with a first resistor, and generating a second current in a second current path comprises controlling a second transistor coupled in series with a second resistor. Configuring a first bias current control circuit may comprises coupling a first p-channel transistor between a reference voltage and a first current control node and coupling a second p-channel transistor between the reference voltage and a second current control node. The method may further comprising configuring a first bias current generator to generate a first current, coupling a first bias control transistor to the first bias control circuit to control the current in the first bias control circuit. Configuring a second bias current control circuit may comprise coupling a first n-channel transistor between the first output and ground and coupling a second n-channel transistor between the second output and ground.

The method may further comprise coupling a second bias control transistor to the second bias control circuit to control the current in the second bias control circuit. A third bias current circuit may be coupled to the second bias generator, wherein the third bias current circuit controls the current in the second bias generator in response to the common mode voltage input. It should be further noted that shifting an input common mode voltage may comprise shifting an input common mode voltage of a differential receiver.

It can therefore be appreciated that new to circuits for and methods of shifting an input common mode voltage have been described. It will be appreciated by those skilled in the art that numerous alternatives and equivalents will be seen to exist that incorporate the disclosed invention. As a result, the invention is not to be limited by the foregoing embodiments, but only by the following claims.

We claim:

1. A circuit for shifting an input common mode voltage, the circuit comprising:
   a first current path configured to generate a first current between a reference voltage and a ground potential, the first current path having a first output;
   a second current path configured to generate a second current between the reference voltage and the ground potential, the second current path having a second output;
   a first bias current control circuit coupled to the first current path and the second current path, wherein the first bias control circuit is configured to receive a differential input signal to control current in first current path and the second current path;
   a second bias current control circuit coupled to the first current path and the second current path, wherein the second bias control circuit is configured to receive the differential input signal to control the current in the first current path and the second current path; and
   a third bias current control circuit configured to receive the differential input signal and coupled to the first current path and the second current path, wherein the third bias current control circuit generates a bias voltage for controlling the current in the first current path and the second current path.

2. The circuit of claim 1 wherein the first current path comprises a first transistor coupled in series with a first resistor, and the second current path comprises a second transistor coupled in series with a second resistor.

3. The circuit of claim 1 wherein the first bias current control circuit comprises a first n-channel transistor coupled between a first current control node and ground and a second n-channel transistor coupled between second current control node and ground.

4. The circuit of claim 3 further comprising a first bias current generator configured to generate a current in the first current path.

5. The circuit of claim 4 further comprising a first bias control transistor coupled to the first bias control circuit to control the current in the first bias control circuit.

6. The circuit of claim 5 wherein the second bias current control circuit comprises a first p-channel transistor coupled between a reference voltage and the first output and a second p-channel transistor coupled between the reference voltage and the second output.

7. The circuit of claim 6 wherein the bias current generator is configured to generate a current in the second current path.

8. The circuit of claim 4 further comprising a second bias control transistor coupled to the second bias current control circuit to control the current in the second bias control circuit.

9. The circuit of claim 1, wherein the third bias current control circuit controls the current in the first bias current generator in response to the differential input signal.

10. The circuit of claim 1 wherein the circuit for shifting the input common mode voltage comprises a differential receiver.

11. A method of shifting an input common mode voltage, the method comprising:
    generating a first current in a first current path between a reference voltage and a ground potential, the first current path having a first output;
    generating a second current in a second current path between the reference voltage and the ground potential, the second current path having a second output;
    configuring a first bias current control circuit to receive a differential input signal to control current in the first current path and the second current path in response to the differential input signal;
    configuring a second bias current control circuit to receive the differential input signal to control the current in the first current path and the second current path in response to the differential input signal; and
    configuring a third bias current control circuit to receive the differential input signal, wherein the third bias current control circuit generates a bias voltage for controlling the current in the first current path and the second current path.

12. The method of claim 11 wherein generating a first current in a first current path comprises controlling a first transistor coupled in series with a first resistor, and generating a second current in a second current path comprises controlling a second transistor coupled in series with a second resistor.

13. The method of claim 11 wherein configuring a first bias current control circuit comprises coupling a first n-channel transistor between a first current control node and ground and coupling a second n-channel transistor between a second current control node and ground.

14. The method of claim 13 further comprising configuring a first bias current generator to generate the first current.

15. The method of claim 14 further comprising coupling a first bias control transistor to the first bias control circuit to control the current in the first bias control circuit.

16. The method of claim 15 wherein configuring a second bias current control circuit comprises coupling a first p-channel transistor between a reference voltage and the first output and coupling a second p-channel transistor between the reference voltage and the second output.

17. The method of claim 16 wherein the bias current generator generates a current in the second current path.

18. The method of claim 17 further comprising coupling a second bias control transistor to the second bias current control circuit to control the current in the second bias current control circuit.

19. The method of claim 14, wherein the third bias current control circuit controls the current in the first bias current generator in response to the differential input signal.

20. The method of claim 11 wherein shifting an input common mode voltage comprises shifting an input common mode voltage of a differential receiver.

* * * * *